US009235469B2

(12) United States Patent
Zhang et al.

(10) Patent No.: US 9,235,469 B2
(45) Date of Patent: Jan. 12, 2016

(54) SYSTEMS AND METHODS FOR INTER-CELL INTERFERENCE MITIGATION IN A FLASH MEMORY (71) Applicant: SEAGATE TECHNOLOGY LLC, Cupertino, CA (US)

(72) Inventors: Fan Zhang, Milpitas, CA (US); Shu Li, San Jose, CA (US); Jun Xiao, Fremont, CA (US); Haitao Xia, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 282 days.

(21) Appl. No.: 13/912,063

(22) Filed: Jun. 6, 2013

(65) Prior Publication Data

US 2014/0351668 A1 Nov. 27, 2014

Related U.S. Application Data (60) Provisional application No. 61/826,464, filed on May 22, 2013.

(51) Int. Cl.
*H03M 13/00* (2006.01)
*G06F 11/10* (2006.01)
*G11C 29/02* (2006.01)
*G11C 16/00* (2006.01)
*G11C 29/04* (2006.01)

(52) U.S. Cl.
CPC ........ *G06F 11/1068* (2013.01); *G06F 11/1048* (2013.01); *G11C 29/028* (2013.01); *G11C 16/00* (2013.01); *G11C 2029/0411* (2013.01); *H03M 13/00* (2013.01)

(58) Field of Classification Search
CPC ........................... G06F 11/1068; H03M 13/45
See application file for complete search history.

(56) References Cited

U.S. PATENT DOCUMENTS

| 7,725,800 | B2 * | 5/2010 | Yang et al. | 714/755 |
| 8,015,499 | B2 * | 9/2011 | Kanaoka | 715/780 |
| 8,060,803 | B2 * | 11/2011 | Kim | 714/752 |
| 8,117,515 | B2 * | 2/2012 | Yang | 714/755 |
| 8,136,022 | B2 * | 3/2012 | Jeong et al. | 714/794 |
| 8,250,434 | B2 | 8/2012 | Yang | |
| 8,457,229 | B2 * | 6/2013 | Seyama | 375/262 |
| 2008/0151704 | A1 | 6/2008 | Harada et al. | |
| 2009/0135693 | A1 | 5/2009 | Kim | |
| 2012/0063022 | A1 | 3/2012 | Mathew | |
| 2012/0063023 | A1 | 3/2012 | Mathew | |

(Continued)

OTHER PUBLICATIONS

Gibson et al "Directions for Shingled-Write and Two-Dimensional Magnetic Recording System" Architectures: Synergies with Solid-State Disks Carnegie Mellon Univ. May 1, 2009.

(Continued)

*Primary Examiner* — Esaw Abraham
(74) *Attorney, Agent, or Firm* — Holland & Hart (57) ABSTRACT The present inventions are related to systems and methods for accessing data from a flash memory, and more particularly to systems and methods for inter-cell interference handling in a flash memory. The systems and methods include receiving soft information corresponding to a series of voltage levels accessed from a block of flash memory cells, calculating corrected soft information based upon the received soft information and a variance of the soft information, and applying a data decoding algorithm to the corrected soft information to yield a data output.

20 Claims, 5 Drawing Sheets

(56) References Cited

U.S. PATENT DOCUMENTS

| | | |
|---|---|---|
| 2012/0063024 A1 | 3/2012 | Mathew |
| 2012/0063284 A1 | 3/2012 | Mathew |
| 2013/0021689 A1 | 1/2013 | Haratsch |
| 2013/0229867 A1* | 9/2013 | Tang et al. ............ 365/185.2 |

OTHER PUBLICATIONS

U.S. Appl. No. 13/784,448, Unpublished (filed Mar. 4, 2013) (Jun Xiao).

U.S. Appl. No. 13/705,116, Unpublished (filed Dec. 4, 2012) (George Mathew).

U.S. Appl. No. 13/618,317, Unpublished (filed Sep. 14, 2012) (Jun Xiao).

Wu, et al., "Equation Based LDPC Decoder for Intersymbol Interference Channels" 2005 IEEE International Conf. on Acoustics, Speech, and Signal Processing vol. 5 Mar. 2005.

* cited by examiner

SYSTEMS AND METHODS FOR INTER-CELL INTERFERENCE MITIGATION IN A FLASH MEMORY

CROSS REFERENCE TO RELATED APPLICATIONS

The present application claims priority to (is a non-provisional of) U.S. Pat. App. No. 61/826,464, entitled "Systems and Methods for Inter-cell Interference Mitigation in a Flash Memory", and filed May 22, 2013 by Zhang et al. The entirety of the aforementioned provisional patent application is incorporated herein by reference for all purposes.

FIELD OF THE INVENTION

The present inventions are related to systems and methods for accessing data from a flash memory, and more particularly to systems and methods for inter-cell interference handling in a flash memory.

BACKGROUND OF THE INVENTION

Flash memory devices include a number of cells implemented as floating gate transistors that are capable of storing a charge. Writing the cells includes programming by Fowler-Nordhiem tunneling until the cell is charged to a desired voltage level. Due to capacitive coupling between neighboring cells, the threshold voltage of the cell charges depending on the amount of coupling with the neighboring cells and the charge levels of the neighboring cells. Such coupling is generally referred to as inter-cell interference. Such inter-cell interference can result in failures in retrieving originally stored data.

Hence, for at least the aforementioned reasons, there exists a need in the art for advanced systems and methods for accessing data from a flash memory device.

BRIEF SUMMARY OF THE INVENTION

The present inventions are related to systems and methods for accessing data from a flash memory, and more particularly to systems and methods for inter-cell interference handling in a flash memory.

Various embodiments of the present invention provide data processing systems that include a soft information correction circuit. The soft information correction circuit is operable to: receive soft information corresponding to a series of voltage levels accessed from a block of memory cells, and to calculate corrected soft information based upon the received soft information and a variance of the soft information.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for accessing data from a flash memory, and more particularly to systems and methods for inter-cell interference handling in a flash memory.

Various embodiments of the present invention provide memory circuits that include inter-cell interference mitigation circuitry. Such inter-cell interference mitigation circuitry is operable to generate soft data corresponding to information accessed from a block of flash memory cells, and to modify the soft data prior to decoding the information accessed from a block of flash memory cells. The modification of the soft data is used to mitigate inter-cell interference. In some cases, the soft data is log likelihood ratio (hereinafter referred to as 'LLR') data.

Some embodiments of the present invention provide data processing systems that include a soft information correction circuit. The soft information correction circuit is operable to: receive soft information corresponding to a series of voltage levels accessed from a block of memory cells, and to calculate corrected soft information based upon the received soft information and a variance of the soft information. In some instances of the aforementioned embodiments, the system is implemented as an integrated circuit. In various instances of the aforementioned embodiments, the data processing system is incorporated in a storage device including a block of flash memory cells. The block of memory cells are a subset of the block of flash memory cells. In some cases, each of the flash memory cells are multi-bit memory cells. In particular cases, the multi-bit memory cells are each capable of storing a voltage level representative of two or three bits.

In some instances of the aforementioned embodiments, the data processing system further includes a data decoder circuit operable to apply a data decoding algorithm to the corrected soft information to yield a data output. In some such instances, the data decoder circuit is a low density data decoder circuit. In one or more instances of the aforementioned embodiments, the soft information is a probability that the voltage levels accessed from a block of memory cells are correct. In some cases, the soft information is log likelihood information.

In various instances of the aforementioned embodiments, calculating the corrected soft information is based at least in part on both the variance and a median of the soft information. In some such instances, the corrected soft information includes: calculating an offset reduced output based upon a combination of the variance and the median, and calculating the corrected soft information based upon the offset reduced output and the median. In various such instances, the variance includes a left side variance and a right side variance. In such instances, the calculating the corrected soft information includes: calculating an offset reduced output based upon a combination of the right side variance, the left side variance, and the median; and calculating the corrected soft information based upon the offset reduced output and the median.

Various embodiments of the present invention provide methods for accessing information from a storage device. The methods include: receiving soft information corresponding to a series of voltage levels accessed from a block of flash memory cells; calculating corrected soft information based upon the received soft information and a variance of the soft information; and applying a data decoding algorithm to the corrected soft information to yield a data output. In some instances of the aforementioned embodiments, the data decoding algorithm is a low density parity check decoding algorithm. In one or more instances of the aforementioned embodiments, calculating the corrected soft information is based at least in part on both the variance and a median of the soft information. In some cases, calculating the corrected soft information includes: calculating an offset reduced output based upon a combination of the variance and the median; and calculating the corrected soft information based upon the offset reduced output and the median. In various cases, the variance includes a left side variance and a right side variance. In such cases, calculating the corrected soft information includes: calculating an offset reduced output based upon a combination of the right side variance, the left side variance, and the median; and calculating the corrected soft information based upon the offset reduced output and the median.

As an example, assume a flash memory device has cells that are each capable of storing three bits of data by charging the cells to one of eight (i.e., $2^3$) different charge levels. Where two adjacent cells (cell i and cell i+1) are charged to the maximum charge level and minimum charge level, respectively, the highest level of interference is expected. Where there is not any inter-cell interference, cell i+1 can be modeled as a Gaussian distribution (N[m, $\sigma^2$]). Where inter-cell interference is included, the aforementioned model of cell i+1 can be modeled as another Gaussian distribution (N[m+$\Delta$m, $(\sigma, \Delta\sigma)^2$]), where $\Delta$m and $\Delta\sigma$ represent the effect of inter-cell interference.

In the absence of inter-cell interference, where the voltage level of cell i+1 is represented as y, the a priori LLR data may be calculated in accordance with the following equation:

$$LLR(\text{cell } i+1) = \log\frac{Pr(x=0|y)}{Pr(x=1|y)},$$

where Pr( ) is probability of the occurrence of the condition in the parenthesis is true, x represents the original value, and y represents the actual value received by reading the memory device. The aforementioned equation can be re-written as follows:

$$LLR(\text{cell } i+1) = \log\frac{Pr(y|x=0)p(0)}{Pr(y|x=1)p(1)},$$

where p(0) is the a priory probability that x is zero, and p(1) is the a priory probability that x is one. The preceding equation can be re-written as follows:

$$LLR(\text{cell } i+1) = \log\frac{\sqrt{\frac{1}{2\pi\sigma^2}}\exp\left(\frac{-(y-m_0)^2}{2\sigma^2}\right)}{\sqrt{\frac{1}{2\pi\sigma^2}}\exp\left(\frac{-(y-m_1)^2}{2\sigma^2}\right)},$$

where $m_0$ is the mean value of the Gaussian distribution given the value of x is zero, and where $m_1$ is the mean value of the Gaussian distribution given the value of x is one. The preceding equation can be recast as:

$$LLR(\text{cell } i+1) = \frac{m_1^2 - m_0^2}{2\sigma^2} - \frac{(m_1 - m_0)y}{\sigma^2};$$

and
by setting $m_0$ equal to m and $m_1$ equal to $-m$ for simplicity:

$$LLR(\text{cell } i+1) = \frac{2my}{\sigma^2}.$$

When inter-cell interference is included, the a priori LLR data may be calculated in accordance with the following equations:

$$LLR'(\text{cell } i+1) = \log\frac{\sqrt{\frac{1}{2\pi(\sigma+\Delta\sigma)^2}}\exp\left(\frac{-(y-[m_0+\Delta m])^2}{2(\sigma+\Delta\sigma)^2}\right)}{\sqrt{\frac{1}{2\pi(\sigma+\Delta\sigma)^2}}\exp\left(\frac{-(y-[m_1+\Delta m])^2}{2(\sigma+\Delta\sigma)^2}\right)};$$

$$LLR'(\text{cell } i+1) = \frac{(\Delta m + m - y)^2}{2(\Delta\sigma+\sigma)^2} + \frac{(y+m)^2}{2\sigma^2} + \log\frac{\sigma}{\Delta\sigma+\sigma};$$

and
by using a Taylor expansion around $\Delta\sigma$ equal to zero and $\Delta$m equal to zero, and assuming $m_0$ is equal to m and $m_1$ is equal to $-m$ for simplicity, $$LLR'(\text{cell } i+1) \approx \left[\frac{2my}{\sigma^2}\right]\left[1+\frac{\Delta m}{2m}\right] - \left[\frac{m}{\sigma^2}\Delta m + \frac{-\sigma^2-(y-m)^2}{\sigma^3}\Delta\sigma\right].$$

The $$\left[\frac{2my}{\sigma^2}\right]$$

portion of the aforementioned equation corresponds to the a priori LLR data without inter-cell interference, the $$\left[1 + \frac{\Delta m}{2m}\right]$$

is a scaling factor, and the $$\left[\frac{m}{\sigma^2}\Delta m + \frac{-\sigma^2 - (y-m)^2}{\sigma^3}\Delta\sigma\right]$$

is an additive LLR component for mitigating inter-cell interference.

Figure 3A:
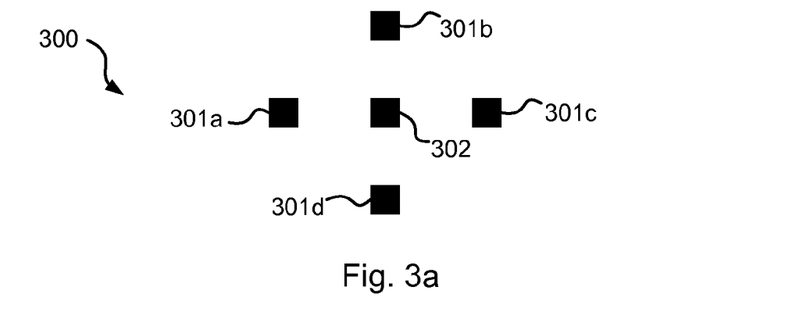
FIGS. 3a-3c show three example graphics.
Figure 3B:
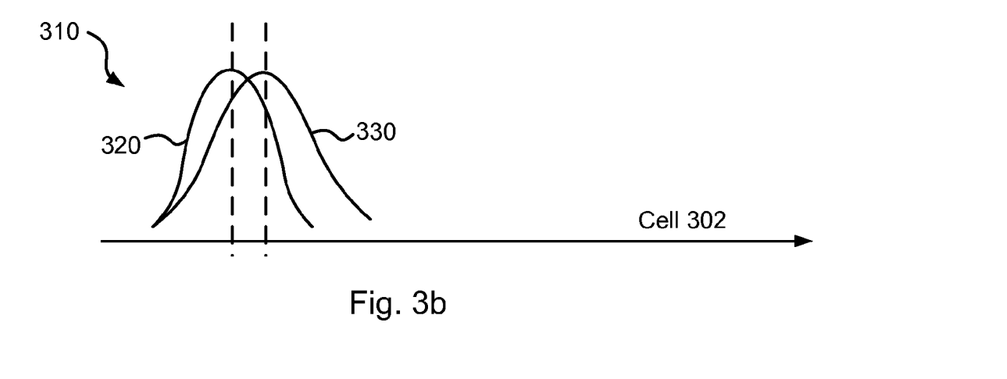
Figure 3C:
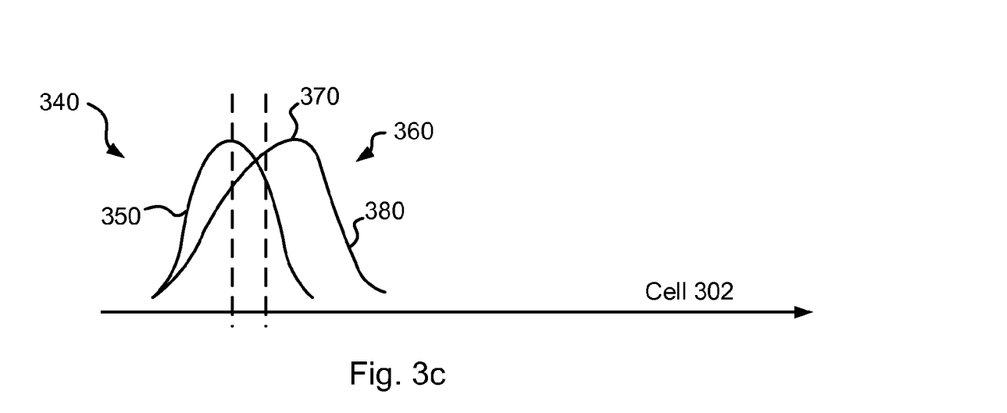

Two different models are used depending upon the particular embodiment of the present invention. The first model does not include any asymmetry of the distribution of cell level. An example of such a model that does not include any asymmetry is shown in a graphic 310 of FIG. 3b where a first curve 320 shows the distribution (N[m, σ²]) without inter-cell interference and a second curve 330 shows the distribution (N[m+Δm, (σ, Δσ)²]) with inter-cell interference. Another example of such a model that includes asymmetric distribution is shown in a graphic 340 of FIG. 3c where a first curve 350 shows the distribution (N[m, σ²]) without inter-cell interference and a second curve 360 shows the distribution (N[m+Δm, (σ, Δσ)²]) with inter-cell interference. Of note, second curve 360 shows a lower distribution 370 (N[m+Δm, (σ, Δσ₁)²]) and an upper distribution 380 (N[m+Δm, (σ, Δσ₂)²]).

Where the model that does not include asymmetry is used, the a priori LLR data is calculated in accordance with the following equation:

$$LLR'(\text{cell } i+1) = \left[\frac{2my}{\sigma^2}\right]\left[1 + \frac{\Delta m}{2m}\right] - \left[\frac{m}{\sigma^2}\Delta m + \frac{-\sigma^2 - (y-m)^2}{\sigma^3}\Delta\sigma\right].$$

In this model only Δm and Δσ need to be estimated. The values of Δm and Δσ can be estimated as a function of the voltage levels of the instant cell (e.g., cell 302 of FIG. 3a) and the voltage levels of the surrounding cells (e.g., cells 301a-301d of FIG. 3a). As the voltage levels in the respective cells can change over time, so can the values of Δm and Δσ. Further, over the life of a flash memory device, the respective values of Δm and Δσ may increase.

In contrast, where the model that does include asymmetry is used, the a priori LLR data is calculated in accordance with the following equation:

$$LLR'(\text{cell } i+1) = \left[\frac{2my}{\sigma^2}\right]\left[1 + \frac{\Delta m}{2m}\right] - \left[\frac{m}{\sigma^2}\Delta m + \frac{\sigma^2 + (y-m)^2}{\sigma^3}\Delta\sigma_1\right],$$

for $y < m + \Delta m$; and $$LLR'(\text{cell } i+1) = \left[\frac{2my}{\sigma^2}\right]\left[1 + \frac{\Delta m}{2m}\right] - \left[\frac{m}{\sigma^2}\Delta m - \frac{\sigma^2 + (y-m)^2}{\sigma^3}\Delta\sigma_2\right],$$

for $y \geq m + \Delta m$.

In this model only Δm, Δσ₁ and Δσ₂ need to be estimated. The values of Δm and Δσ can be estimated as a function of the voltage levels of the instant cell (e.g., cell 302 of FIG. 3a) and the voltage levels of the surrounding cells (e.g., cells 301a-301d of FIG. 3a). As the voltage levels in the respective cells can change over time, so can the values of Δm, Δσ₁ and Δσ₂. Further, over the life of a flash memory device, the respective values of Δm, Δσ₁ and Δσ₂ may increase.

Different processes may be used to train a circuit estimating Δm, Δσ₁ and Δσ₂. The first training approach provides for offline estimation of Δm, Δσ₁ and Δσ₂. In this offline estimation, a flash memory controller operates initially on a particular die and starts with a free run of several pages of the flash memory die and extracts the distribution of the distorted a priori LLR data (i.e., the a priori LLR data distorted by inter-cell interference). Using the distorted samples' distribution, the Δm, Δσ₁ and Δσ₂ parameters are estimated. Once the initial estimate is complete, the flash memory controller returns to re-read the first page of the flash memory die and from there continues reading and decoding received data. Each time the flash memory controller switches zone/block, the Δm, Δσ₁ and Δσ₂ parameters are re-estimated to assure up to date parameters.

The second training approach provides for online estimation of Δm, Δσ₁ and Δσ₂. In this online estimation, a flash memory controller accumulates former pages' distorted a priori LLR data, and extracts the distribution on the fly. The latest several pages are used to estimate the Δm, Δσ₁ and Δσ₂ parameters. Each time the flash memory controller switches zone/block, the accumulated distribution is reset to zero to eliminate less relevant data. In comparison, the offline approach for estimation is not used during standard operation and thus exhibits a power savings when compared with online approach, however, the offline estimation exhibits delay in updating the parameters that does not occur in the online estimation.

In both the online and offline approaches, a sample set (i.e., a number of pages of flash memory) is selected to be used in training the Δm, Δσ₁ and Δσ₂ parameters. The selected sample set should be large enough to ensure that the statics of distorted a priori LLR data is representative of a broader range of data in the flash memory. However, the sample set should be small enough to reduce the latency experienced in training the Δm, Δσ₁ and Δσ₂ parameters. In some embodiments of the present invention, a sample set between two hundred (200) and six hundred (600) 4 kB pages. The distribution of the distorted a priori LLR data is fit into the previously developed equation:

$$LLR'(\text{cell } i+1) = \left[\frac{2my}{\sigma^2}\right]\left[1 + \frac{\Delta m}{2m}\right] - \left[\frac{m}{\sigma^2}\Delta m + \frac{\sigma^2 + (y-m)^2}{\sigma^3}\Delta\sigma_1\right],$$

for $y < m + \Delta m$; and $$LLR'(\text{cell } i+1) = \left[\frac{2my}{\sigma^2}\right]\left[1 + \frac{\Delta m}{2m}\right] + \left[\frac{m}{\sigma^2}\Delta m - \frac{\sigma^2 + (y-m)^2}{\sigma^3}\Delta\sigma_2\right],$$

for $y \geq m + \Delta m$.

The resulting fitted formula has the same linear format as y=ax+b, where x is the ideal a priori LLR data and y is the distorted a priori LLR data.

In some cases, the aforementioned parameter estimation may be hardware intensive. In some embodiments of the present invention, a simplified hardware approach is used where the individual parameters Δm, Δσ₁ and Δσ₂ are not trained, but rather proxies of the parameters are trained. In particular, the following proxies, A and B, defined as follows:

$$A = \left[1 + \frac{\Delta m}{2m}\right]; \text{ and } B = \begin{cases} \left[\frac{m}{\sigma^2}\Delta m - \frac{2\sigma^2 \Delta \sigma_1}{\sigma^3}\right], \text{ left side} \\ \left[\frac{m}{\sigma^2}\Delta m - \frac{2\sigma^2 \Delta \sigma_2}{\sigma^3}\right], \text{ right side} \end{cases}.$$

The values of A and B can then be obtained using the same linear fitting discussed above.

Figure 1:
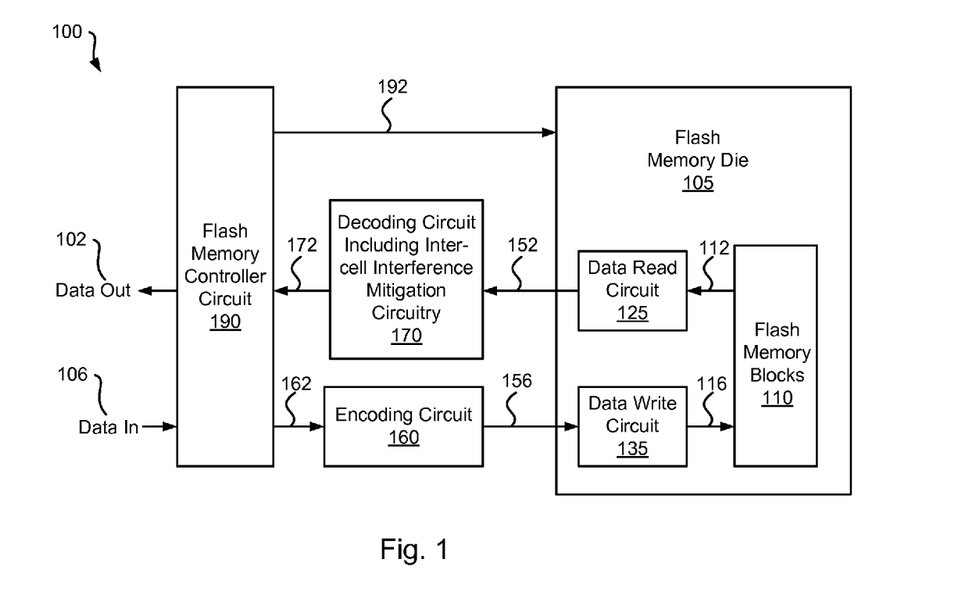
FIG. 1 shows a memory system comprising a decoding circuit including inter-cell interference mitigation circuitry in accordance with various embodiments of the present invention.

Turning to FIG. 1, a memory system 100 comprising a decoding circuit 170 including inter-cell interference mitigation circuitry in accordance with various embodiments of the present invention. Memory system 100 includes a flash memory die 105 including a number of flash memory blocks 110. These flash memory blocks 110 include floating gate cells that may be charged to one of a number of voltage levels with each voltage level corresponding to a different bit pattern. In addition, flash memory die 105 includes a data read circuit 125 operable to receive addressed voltage levels 112, and to pass corresponding bit patterns 152. Flash memory die 105 includes a data write circuit 135 operable to receive bit patterns 156 and to charge addressed cells in flash memory bocks 110 to voltage levels 116 corresponding to the received bit patterns 156. The addressed cells are identified by an address data 192 provided from flash memory controller circuit 190.

Flash memory controller circuit 190 receives a data in 106 that includes both address and data with the address data indicating a location to which the data will be stored; and a data out 102 that provides addressed read data to a requester. Whenever a read or a write is requested, the location of the requested read or write is identified to flash memory die 105 by address data 192. Where a write is requested, data in 106 is formatted as write data 162 that is provided to an encoding circuit 160. Where a read is requested, the data identified by address data 192 is ultimately provided to flash memory controller circuit 190 as read data 172.

Read data 172 is provided by data decoding circuit 170 which applies a data decoding algorithm to data received as bit patterns 152 from data read circuit 125. In one particular embodiment of the present invention, the data decoding algorithm is a low density parity check algorithm. Based upon the disclosure provided herein, one of ordinary skill in the art will recognize a variety of data decoding algorithms that may be used in relation to different embodiments of the present invention. Encoding circuit 160 encodes write data 162 using an encoding algorithm to yield bit patterns 156. The encoding algorithm is the complement of the decoding algorithm applied by data decoding circuit 170. In one particular embodiment of the present invention, the data encoding algorithm is a low density parity check algorithm. Based upon the disclosure provided herein, one of ordinary skill in the art will recognize a variety of data encoding algorithms that may be used in relation to different embodiments of the present invention.

Figure 2:
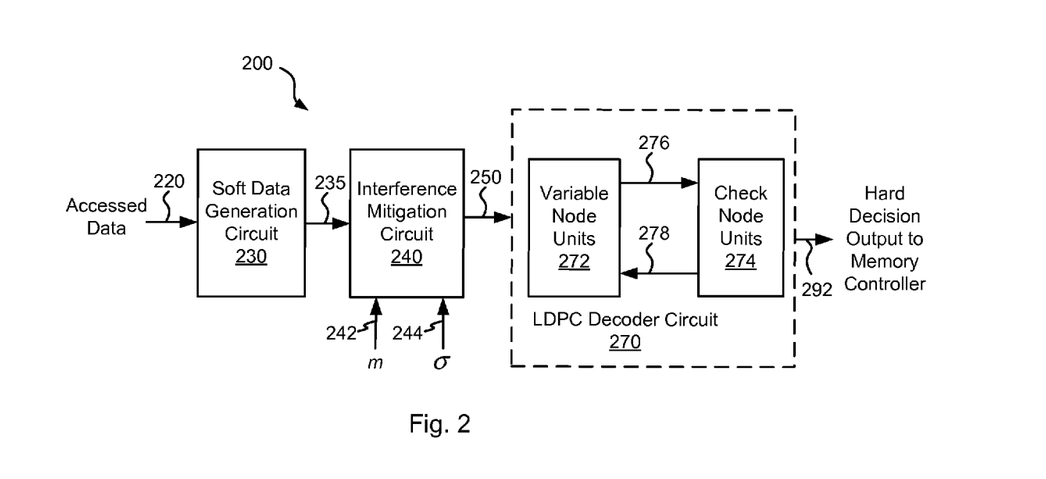
FIG. 2 depicts a decoding circuit including inter-cell interference mitigation circuitry in accordance with some embodiments of the present invention.

Turning to FIG. 2, a decoding circuit 200 including inter-cell interference mitigation circuitry is depicted in accordance with some embodiments of the present invention. Decoding circuit 200 may be used in place of decoding circuit 170 discussed above in relation to FIG. 1. In such a case, a hard decision output 292 is provided as read data 172, and bit patterns 152 are received as accessed data 220. Decoding circuit 220 includes a soft data generation circuit 230. Soft data generation circuit 230 may be any circuit known in the art that is capable of generating soft information based upon an input data set. The soft data may be any information indicating a probability of particular bit values. In one particular embodiment of the present invention, the soft data is log likelihood ratio (LLR) data. In various embodiments of the present invention, soft data generation circuit 230 is implemented as a data detector circuit. Such a data detector circuit may be, but is not limited to, a maximum a posteriori data detector circuit or a Viterbi algorithm data detector circuit. The generated soft data is provided as soft information 235 to an interference mitigation circuit 240.

Interference mitigation circuit 240 operates to mitigate inter-cell interference (i.e., interference evident in bit patterns 152 due to cells surrounding the cell from which bit patterns 152 were derived). Interference mitigation circuit 240 mitigates the interference by adding an offset value from instances of soft information 235 to yield an offset reduced data output in accordance with the following equation:

Offset Reduced Output =

$$\text{Soft Information } 235 + \left[\frac{m}{\sigma^2}\Delta m + \frac{-\sigma^2 - (y-m)^2}{\sigma^3}\Delta\sigma\right],$$

where m is an estimated mean value provided as an input 242, and σ is an estimated variance value provided as an input 244. The estimated mean value and estimated variance value are calculated based upon data from a preceding block of data processed by data decoding circuit 200. The aforementioned offset reduced output is then scaled using a calculated scaling value to yield a corrected soft information 250 in accordance with the following equation:

$$\text{Corrected Soft Information } 250 = \text{Offset Reduced Output} * \frac{1}{1 + \frac{\Delta m}{2m}}.$$

Of note, while decoding circuit 200 is previously described as mitigating only symmetric interference, it may be modified to account for asymmetric interference. To do so, interference mitigation circuit 240 first determines whether the received instance of soft information 235 corresponds to a voltage less than the estimated actual mean plus interference mean consistent with the following equation:

$$y < m + \Delta m,$$

where y represents the voltage value, m represents the estimated actual mean, and Δm represents the estimated interference mean. Where the voltage is less than the estimated actual mean plus interference mean, interference mitigation circuit 240 adds an offset value to soft information 235 in accordance to yield an offset reduced data output in accordance with the following equation:

Offset Reduced Output =

$$\text{Soft Information } 235 + \left[\frac{m}{\sigma^2}\Delta m + \frac{\sigma^2 + (y-m)^2}{\sigma^3}\Delta\sigma_1\right],$$

where $\Delta\sigma_1$ is a left side variance provided as an input to interference offset circuit 240. Alternatively, where the voltage is not less than the estimated actual mean plus interference mean, interference mitigation circuit 240 subtacts an offset value to soft information 235 in accordance to yield an offset reduced data output in accordance with the following equation:

$$\text{Offset Reduced Output} = \text{Soft Information 235} - \left[\frac{m}{\sigma^2}\Delta m - \frac{\sigma^2 + (y-m)^2}{\sigma^3}\Delta\sigma_2\right],$$

where $\Delta\sigma_2$ is a right side variance provided as an input to interference offset circuit 240. The aforementioned offset reduced output is then scaled using a calculated scaling value to yield a corrected soft information 250 in accordance with the following equation:

$$\text{Corrected Soft Information 250} = \text{Offset Reduced Output} * \frac{1}{1+\frac{\Delta m}{2m}}.$$

Corrected soft information 250 is then provided to a low density parity check decoder circuit 270 that applies a low density parity check algorithm to the received data to yield hard decision output 292. As shown, low density parity check decoder circuit 270 includes variable node units 272 and check node units 274 that pass c2v messages 278 and v2c messages 274 to each other in an iterative manner to obtain hard decision output 292. It should be noted that low density parity check decoder circuit 270 may be any low density parity check decoder circuit known in the art.

Figure 4:
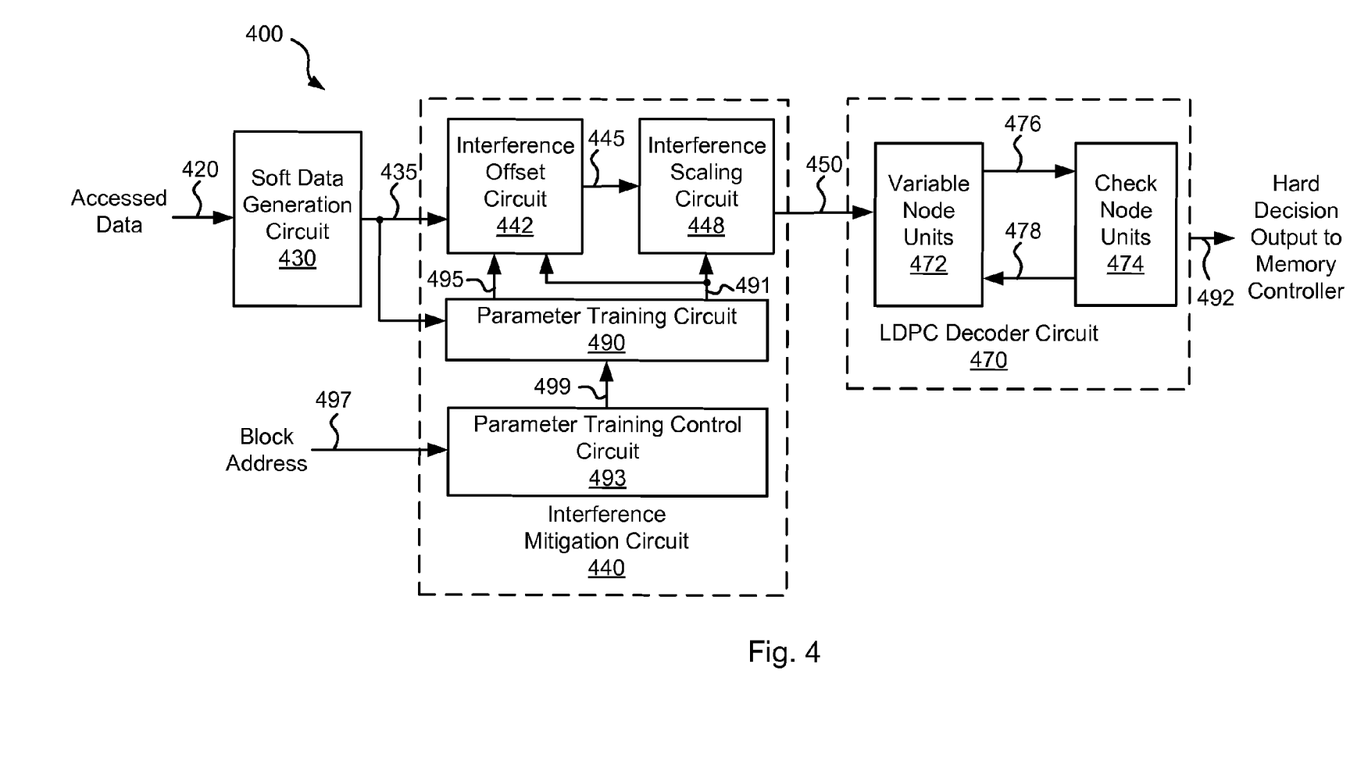
FIG. 4 shows a decoding circuit including inter-cell interference mitigation circuitry with parameter training circuitry in accordance with some embodiments of the present invention.

Turning to FIG. 4, a decoding circuit 400 including inter-cell interference mitigation circuitry with parameter training circuitry is shown in accordance with some embodiments of the present invention. Decoding circuit 400 may be used in place of decoding circuit 170 discussed above in relation to FIG. 1. In such a case, a hard decision output 492 is provided as read data 172, and bit patterns 152 are received as accessed data 420. Decoding circuit 400 includes a soft data generation circuit 430. Soft data generation circuit 430 may be any circuit known in the art that is capable of generating soft information based upon an input data set. The soft data may be any information indicating a probability of particular bit values. In one particular embodiment of the present invention, the soft data is log likelihood ratio (LLR) data. In various embodiments of the present invention, soft data generation circuit 430 is implemented as a data detector circuit. Such a data detector circuit may be, but is not limited to, a maximum a posteriori data detector circuit or a Viterbi algorithm data detector circuit. The generated soft data is provided as soft information 435 to an interference mitigation circuit 440.

Interference mitigation circuit 440 operates to mitigate inter-cell interference (i.e., interference evident in bit patterns 152 due to cells surrounding the cell from which bit patterns 152 were derived). Interference mitigation circuit 440 includes an interference offset circuit 442, an interference scaling circuit 448, a parameter training circuit 490, and a parameter training control circuit 493. Interference offset circuit 442 adds an offset value from instances of soft information 435 to yield an offset reduced data output 445 in accordance with the following equation:

$$\text{Offset Reduced Output 445} =$$
$$\text{Soft Information 435} + \left[\frac{m}{\sigma^2}\Delta m + \frac{-\sigma^2 - (y-m)^2}{\sigma^3}\Delta\sigma\right],$$

where m is an estimated mean value 491 and σ is an estimated variance value 495 each provided from parameter training circuit 490.

Offset reduced output 445 is provided to interference scaling circuit 448 where it is multiplied by a scalar value to yield a corrected soft information 450 in accordance with the following equation:

$$\text{Corrected Soft Information 450} = \text{Offset Reduced Output 445} * \frac{1}{1+\frac{\Delta m}{2m}},$$

again, where m is an estimated mean value 491 provided from parameter training circuit 490.

Parameter training circuit 490 calculates a mean and a variance of the received soft information 435 across a block of data, and use the mean and variance values for the next block of data to be processed. The calculated mean value is provided as estimated mean value 491, and the calculated variance value is provided as estimated variance value 495. Parameter training circuit 490 is controlled by parameter training control circuit 493 that provides a block change output 499 each time access to a given block changes to another block as indicated by a received block address 497 that corresponds to address data 192 of FIG. 1. The parameter training done by the combination of parameter training control circuit 493 and parameter training circuit 490 may be either offline training or online training as described above depending upon the particular implementation of decoding circuit 400.

Corrected soft information 450 is then provided to a low density parity check decoder circuit 470 that applies a low density parity check algorithm to the received data to yield hard decision output 492. As shown, low density parity check decoder circuit 470 includes variable node units 472 and check node units 474 that pass c2v messages 478 and v2c messages 474 to each other in an iterative manner to obtain hard decision output 492. It should be noted that low density parity check decoder circuit 470 may be any low density parity check decoder circuit known in the art.

Figure 5:
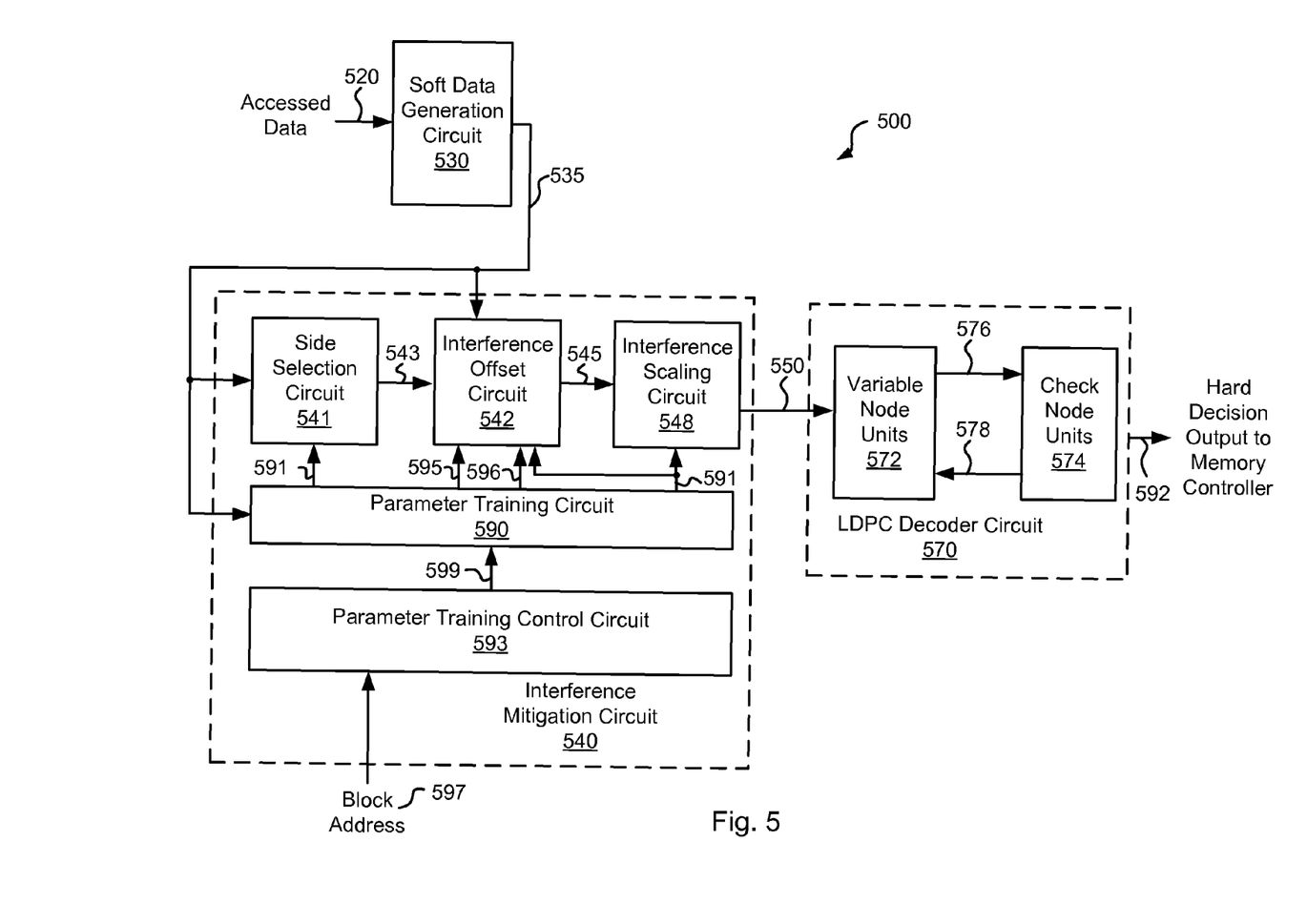
FIG. 5 shows another decoding circuit including asymmetric inter-cell interference mitigation circuitry with parameter training circuitry in accordance with some embodiments of the present invention.

Turning to FIG. 5, a decoding circuit 500 including asymmetric inter-cell interference mitigation circuitry with parameter training circuitry is shown in accordance with some embodiments of the present invention. Decoding circuit 500 may be used in place of decoding circuit 170 discussed above in relation to FIG. 1. In such a case, a hard decision output 592 is provided as read data 172, and bit patterns 152 are received as accessed data 520. Decoding circuit 500 includes a soft data generation circuit 530. Soft data generation circuit 530 may be any circuit known in the art that is capable of generating soft information based upon an input data set. The soft data may be any information indicating a probability of particular bit values. In one particular embodiment of the present invention, the soft data is log likelihood ratio (LLR) data. In various embodiments of the present invention, soft data generation circuit 430 is implemented as a data detector circuit. Such a data detector circuit may be, but is not limited to, a maximum a posteriori data detector circuit or a Viterbi algorithm data detector circuit. The generated soft data is provided as soft information 535 to an interference mitigation circuit 540.

Interference mitigation circuit 540 operates to mitigate inter-cell interference (i.e., interference evident in bit patterns 152 due to cells surrounding the cell from which bit patterns 152 were derived). Interference mitigation circuit 540 includes a side selection circuit 541, an interference offset circuit 542, an interference scaling circuit 548, a parameter training circuit 590, and a parameter training control circuit 593. Side selection circuit 541 selects whether a left side or right side mitigation is to be performed based upon a comparison of soft information 535 to average values. In particular, side selection circuit 541 determines whether the received instance of soft information 235 corresponds to a voltage less than the estimated actual mean plus interference mean consistent with the following equation:

$$y < m + \Delta m,$$

where y represents the voltage value, m represents the estimated actual mean, and $\Delta m$ represents the estimated interference mean. The value of $m+\Delta m$ is received as an average value 591 from parameter training circuit 591. Where the value is less, side selection circuit 541 asserts a side selection output 543 low. Alternatively, side selection circuit 541 asserts side selection output 543 high.

Interference offset circuit 542 augments soft information 535 by an offset value selected based upon the assertion level of side selection output 543. Where side selection output 543 is asserted low indicating a left side offset, interference offset circuit 542 adds an offset as follows to yield an offset reduced output 545:

$$\text{Offset Reduced Output } 545 = \text{Soft Information } 535 + \left[ \frac{m}{\sigma^2} \Delta m + \frac{\sigma^2 + (y-m)^2}{\sigma^3} \Delta \sigma_1 \right],$$

where $\Delta \sigma_1$ is received as a variance input 595 from parameter training circuit 590. Otherwise, where side selection output 543 is asserted high indicating a right side offset, interference offset circuit 542 subtracts an offset as follows to yield an offset reduced output 545:

$$\text{Offset Reduced Output } 545 = \text{Soft Information } 535 + \left[ \frac{m}{\sigma^2} \Delta m - \frac{\sigma^2 + (y-m)^2}{\sigma^3} \Delta \sigma_2 \right],$$

where $\Delta \sigma_2$ is received as a variance input 596 from parameter training circuit 590. Parameter m is an estimated mean value and $\sigma$ is an estimated variance value 591 each provided from parameter training circuit 590.

Offset reduced output 545 is provided to interference scaling circuit 548 where it is multiplied by a scalar value to yield a corrected soft information 550 in accordance with the following equation:

$$\text{Corrected Soft Information } 550 = \text{Offset Reduced Output } 545 * \frac{1}{1 + \frac{\Delta m}{2m}},$$

again, where m is an estimated mean value 591 provided from parameter training circuit 590.

Parameter training circuit 590 calculates a left variance, a right variance, and a mean of the received soft information 535 across a block of data, and use the mean and variance values for the next block of data to be processed. The calculated mean value is provided as estimated mean value 591, and the calculated left variance and right variance are provided as estimated variance value 595 and estimated variance value 596, respectively. Parameter training circuit 590 is controlled by parameter training control circuit 593 that provides a block change output 599 each time access to a given block changes to another block as indicated by a received block address 597 that corresponds to address data 192 of FIG. 1. The parameter training done by the combination of parameter training control circuit 593 and parameter training circuit 590 may be either offline training or online training as described above depending upon the particular implementation of decoding circuit 500.

Corrected soft information 550 is then provided to a low density parity check decoder circuit 570 that applies a low density parity check algorithm to the received data to yield hard decision output 592. As shown, low density parity check decoder circuit 470 includes variable node units 572 and check node units 574 that pass c2v messages 578 and v2c messages 574 to each other in an iterative manner to obtain hard decision output 592. It should be noted that low density parity check decoder circuit 570 may be any low density parity check decoder circuit known in the art.

Figure 6:
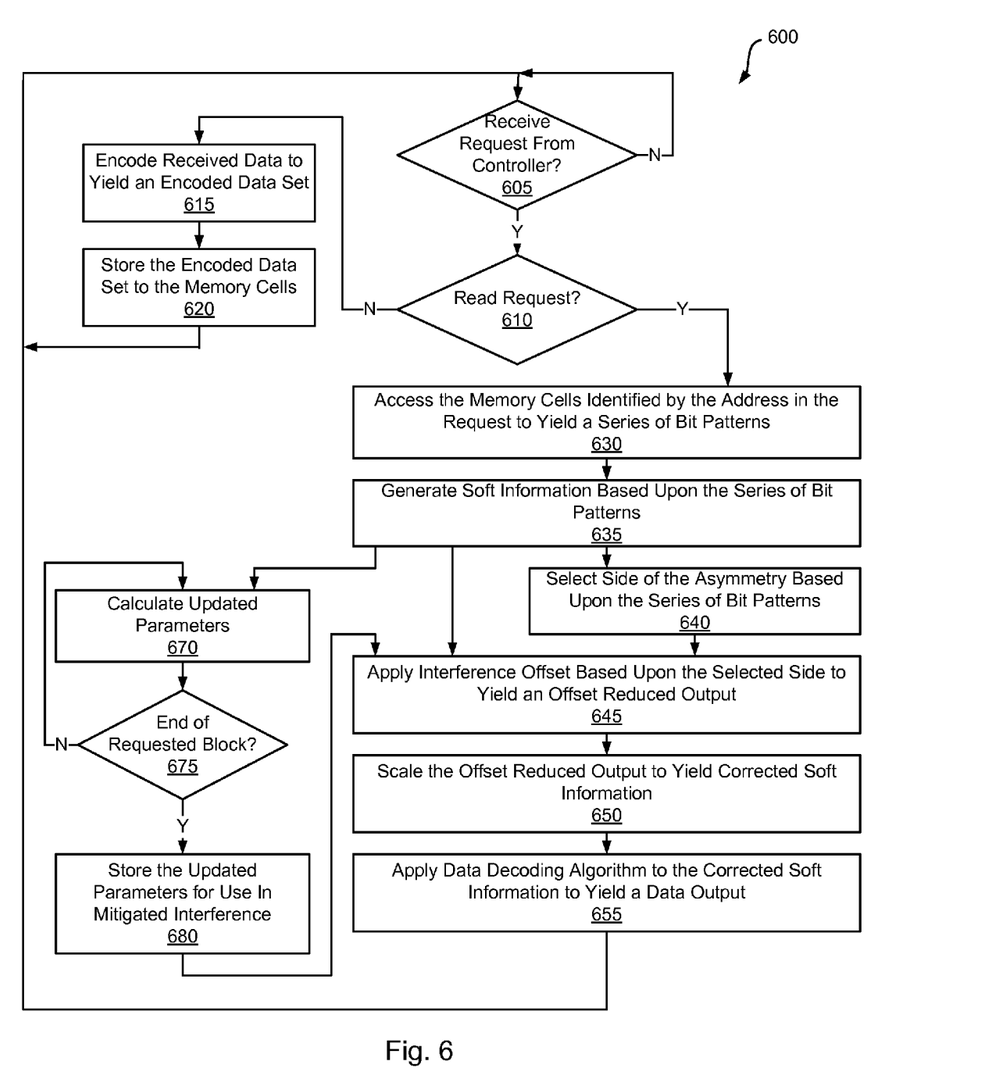
FIG. 6 is a flow diagram showing a method for inter-cell interference mitigation in accordance with various embodiments of the present invention.

Turning to FIG. 6, a flow diagram 600 shows a method for inter-cell interference mitigation in accordance with various embodiments of the present invention. Following flow diagram 600, a request is received from a controller to access information from a flash memory device (block 605). The request includes an address indicating memory cells in the flash memory device, and an indication of whether the request is to read the data from the memory cells or to write data to the memory celles. Where the request is a request to write data to the memory cells of the flash memory (block 610), a data set to be written that was received as part of the request is encoded (block 615). In some embodiments of the present invention, the encoding is low density parity check encoding as is known in the art. Based upon the disclosure provided herein, one of ordinary skill in the art will recognize other encoding approaches that may be used in relation to different embodiments of the present invention. The encoded data set is then stored to memory cells in the flash memory device (bock 620).

Alternatively, where the request is a request to read data (block 610), the memory cells identified by the request are accessed to yield a series of bit patterns (block 630). The information accessed from the memory cells is voltage level values which are then converted to bit patterns using an analog to digital conversion circuit. Soft information is then generated for the bit patterns (block 635). This soft information indicates a probability that the bit pattern is correct or not. In some embodiments of the present invention, the soft information is LLR data as is known in the art. Based upon the disclosure provided herein, one of ordinary skill in the art will recognize a variety of approaches that may be used for generating soft information in accordance with one or more embodiments of the present invention.

A side of the asymmetry is selected based upon the series of bit patterns (block 640). In particular, it is determined whether the received voltage value from the particular memory cell (represented as the series of bit patterns) is less than a value m+Δm determined as described below. The following equation represents the comparison:

$$y < m+\Delta m,$$

where y represents the voltage value, m represents the estimated actual mean, and Δm represents the estimated interference mean. Where the value is less, then a left side asymmetry is selected (block 640). Otherwise, a right side asymmetry is selected (block 640).

Based upon the selected side, an interference offset is applied to yield an offset reduced output (block 645). The offset reduced output is calculated in accordance with the following equations:

$$\text{Offset Reduced Output} = \text{Soft Information} + \left[\frac{m}{\sigma^2}\Delta m + \frac{\sigma^2 + (y-m)^2}{\sigma^3}\Delta\sigma_1\right],$$

and $$\text{Offset Reduced Output} = \text{Soft Information} + \left[\frac{m}{\sigma^2}\Delta m - \frac{\sigma^2 + (y-m)^2}{\sigma^3}\Delta\sigma_2\right],$$

where $\Delta\sigma_1$ is a variance input calculated as a left side variance calculated by a parameter calculation circuit, and $\Delta\sigma_2$ is a variance input calculated as a right side variance by a parameter calculation circuit. Parameter m is an estimated mean value and σ is an estimated variance each provided by the parameter calculation circuit. The offset reduced output is then scaled to yield a corrected soft information in accordance with the following equation (block 650):

$$\text{Corrected Soft Information} = \text{Offset Reduced Output} * \frac{1}{1+\frac{\Delta m}{2m}},$$

again, where m is an estimated mean value provided from the parameter calculation circuit.

A data decoding algorithm is applied to the corrected soft information to yield a data output (block 655). The decoding algorithm provides the reverse process of the encoding algorithm of block 615. Thus, where the encoding algorithm of block 615 is a low density parity check encoding algorithm, the decoding algorithm of block 655 is a low density parity check decoding algorithm as is known in the art. Based upon the disclosure provided herein, one of ordinary skill in the art will recognize a variety of decoding algorithms that may be used in relation to different embodiments of the present invention.

In addition, the parameters used in calculating the offset reduced output (block 645) and the corrected soft information (block 650) are updated (block 670). In particular, the following parameters are calculated: a left variance (a variance of all values less than a center voltage), a right variance (a variance of all values greater than the center voltage), and a mean of the received soft information across a block of data (m+Δm). It is determined if the end of a requested block of data being accessed (block 675). Where it is not the end of the block (block 675), the next received data are incorporated into the previously mentioned calculated parameters (block 670). Alternatively, where it is the end of the block (block 675), the updated parameters are stored for use in mitigating interference in the next requested block (block 680).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for priority based data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a soft information correction circuit operable to:
   receive soft information corresponding to a series of voltage levels accessed from a block of memory cells;
   calculate an offset reduced output of the received soft information by adding an offset value to the received soft information, the offset value being based on an estimated mean value and an estimated variance value associated with the soft information; and
   calculate corrected soft information by scaling the offset reduced output based on a scaling value derived from the estimated mean value.

2. The data processing system of claim 1, wherein the data processing system further comprises:
   a data decoder circuit operable to apply a data decoding algorithm to the corrected soft information to yield a data output.

3. The data processing system of claim 2, wherein the data decoder circuit is a low density data decoder circuit.

4. The data processing system of claim 1, wherein calculating the corrected soft information is based at least in part on both the variance and a median of the soft information.

5. The data processing system of claim 4, wherein calculating the corrected soft information comprises:
   calculating an offset reduced output based upon a combination of the variance and the median; and
   calculating the corrected soft information based upon the offset reduced output and the median.

6. The data processing system of claim 4, wherein the variance includes a left side variance and a right side variance, and wherein calculating the corrected soft information comprises:
   calculating an offset reduced output based upon a combination of the right side variance, the left side variance, and the median; and
   calculating the corrected soft information based upon the offset reduced output and the median.

7. The data processing system of claim 1, wherein the soft information is a probability that the voltage levels accessed from a block of memory cells are correct.

8. The data processing system of claim 7, wherein the soft information is log likelihood information.

9. The data processing system of claim 1, wherein the system is implemented as an integrated circuit.

10. The data processing system of claim 1, wherein the data processing system is incorporated in a storage device comprising:
   a block of flash memory cells, wherein the block of memory cells are a subset of the block of flash memory cells.

11. The data processing system of claim 10, wherein each of the flash memory cells are multi-bit memory cells.

12. The data processing system of claim 11, wherein the multi-bit memory cells are each capable of storing a voltage level representative of a number of bits, and wherein the number of bits is selected from a group consisting of: two bits, and three bits.

13. A method for accessing information from a storage device, the method comprising:
   receiving, via a processor, soft information corresponding to a series of voltage levels accessed from a block of flash memory cells;
   calculating, via the processor, an offset reduced output of the received soft information by adding an offset value to the received soft information, the offset value being based on an estimated mean value and an estimated variance value associated with the soft information;
   calculating, via the processor, corrected soft information by scaling the offset reduced output based on a scaling value derived from the estimated mean value; and
   applying, via the processor, a data decoding algorithm to the corrected soft information to yield a data output.

14. The method of claim 13, wherein the data decoding algorithm is a low density parity check decoding algorithm.

15. The method of claim 13, wherein calculating the corrected soft information is based at least in part on both the variance and a median of the soft information.

16. The method of claim 15, wherein calculating the corrected soft information comprises:
   calculating an offset reduced output based upon a combination of the variance and the median; and calculating the corrected soft information based upon the offset reduced output and the median.

17. The method of claim 15, wherein the variance includes a left side variance and a right side variance, and wherein calculating the corrected soft information comprises:
   calculating an offset reduced output based upon a combination of the right side variance, the left side variance, and the median; and
   calculating the corrected soft information based upon the offset reduced output and the median.

18. The method of claim 13, wherein the soft information is a probability that the voltage levels accessed from a block of memory cells are correct.

19. The method of claim 18, wherein the soft information is log likelihood information.

20. A storage device, the storage device comprising:
   a block of memory cells, wherein each of the memory cells is operable to store a voltage level representing two or more bits;
   a soft information correction circuit operable to:
      receive soft information corresponding to a series of voltage levels accessed from the memory cells;
      calculate an offset reduced output of the received soft information by adding an offset value to the received soft information, the offset value being based on an estimated mean value and an estimated variance value associated with the soft information;
      calculate corrected soft information by scaling the offset reduced output based on a scaling value derived from the estimated mean value; and
   a data decoder circuit operable to apply a data decoding algorithm to the corrected soft information to yield a data output.

* * * * *